United States Patent
Hwang et al.

(10) Patent No.: US 11,450,710 B2
(45) Date of Patent: Sep. 20, 2022

(54) DISPLAY DEVICE

(71) Applicant: SAMSUNG ELECTRONICS CO., LTD., Suwon-si (KR)

(72) Inventors: Kyungwook Hwang, Hwaseong-si (KR); Hoyoung Ahn, Suwon-si (KR); Junhee Choi, Seongnam-si (KR); Kiho Kong, Suwon-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 17/191,619

(22) Filed: Mar. 3, 2021

(65) Prior Publication Data

US 2021/0193733 A1 Jun. 24, 2021

Related U.S. Application Data

(63) Continuation of application No. 16/557,451, filed on Aug. 30, 2019, now Pat. No. 10,971,543.

(30) Foreign Application Priority Data

Sep. 13, 2018 (KR) .................. 10-2018-0109721

(51) Int. Cl.
*H01L 27/15* (2006.01)
*H01L 33/40* (2010.01)
(Continued)

(52) U.S. Cl.
CPC .......... *H01L 27/156* (2013.01); *H01L 33/405* (2013.01); *H01L 33/42* (2013.01);
(Continued)

(58) Field of Classification Search
CPC ... H01L 27/156; H01L 27/322; H01L 33/405; H01L 51/5237; H01L 33/507
See application file for complete search history.

(56) References Cited

U.S. PATENT DOCUMENTS 10,367,122 B2 7/2019 Bonar et al.
10,826,022 B2 * 11/2020 Suzuki ............... H01L 51/5271
(Continued)

FOREIGN PATENT DOCUMENTS

JP    2003-243154 A    8/2003
JP     2008-66103 A    3/2008
(Continued)

OTHER PUBLICATIONS

Communication dated May 11, 2020, issued by the European Patent Office in European Patent Application No. 19196618.3.

*Primary Examiner* — Changhyun Yi
(74) *Attorney, Agent, or Firm* — Sughrue Mion, PLLC

(57) ABSTRACT

A display device includes a substrate, an emissive layer; a plurality of color converting layers that share the emissive layer, a barrier arranged on the emissive layer between the plurality of color converting layers, a first insulating layer provided between the plurality of color converting layers and the emissive layer and a second insulating layer provided between the first insulating layer and the plurality of color converting layers. The barrier spatially separates the plurality of color converting layers from each other and the first insulating layer has a plurality of first openings respectively corresponding to the plurality of color converting layers.

20 Claims, 9 Drawing Sheets

(51) Int. Cl.
- *H01L 33/58* (2010.01)
- *H01L 33/46* (2010.01)
- *H01L 33/50* (2010.01)
- *H01L 33/42* (2010.01)

(52) U.S. Cl.
CPC ............ *H01L 33/46* (2013.01); *H01L 33/507* (2013.01); *H01L 33/58* (2013.01)

(56) References Cited

U.S. PATENT DOCUMENTS

| | | |
|---|---|---|
| 2017/0346039 A1 | 11/2017 | Kato |
| 2018/0114937 A1* | 4/2018 | Ito ..................... H04N 5/23293 |
| 2019/0140016 A1 | 5/2019 | Hwang et al. |
| 2019/0386250 A1 | 12/2019 | Suzuki |

FOREIGN PATENT DOCUMENTS

| | | |
|---|---|---|
| KR | 10-2013-0045746 A | 5/2013 |
| KR | 10-2017-0084139 A | 7/2017 |
| KR | 10-2017-0091300 A | 8/2017 |
| KR | 10-2019-0052887 A | 5/2019 |

\* cited by examiner

DISPLAY DEVICE

CROSS-REFERENCE TO RELATED APPLICATION

This application is a continuation of U.S. application Ser. No. 16/557,451, filed Aug. 30, 2019, which claims priority to Korean Patent Application No. 10-2018-0109721, filed on Sep. 13, 2018, in the Korean Intellectual Property Office, the disclosures of which are incorporated herein in their entirety by reference.

BACKGROUND

1. Field

Example embodiments consistent with the present disclosure relates to display devices and methods of manufacturing the display devices, and more particularly, to display devices having an improved color quality.

2. Description of the Related Art

As display devices, liquid crystal displays (LCD) and organic light-emitting diode (OLED) displays are widely used. Recently, the technique of manufacturing a high-resolution display device by using a micro-light-emitting diode (LED) is drawing attention. However, highly efficient compact LED chips are needed for manufacturing high-resolution display devices, and a difficult transfer technique is required to arrange compact LED chips at appropriate positions.

SUMMARY

Provided is a high-resolution display device having an improved optical efficiency and color quality.

Additional aspects will be set forth in part in the description which follows and, in part, will be apparent from the description, or may be learned by practice of the presented embodiments.

In accordance with an aspect of the disclosure, there is provided a display device comprising: a substrate; an emissive layer provided on the substrate and configured to emit light; a plurality of color converting layers provided on the emissive layer, each of the plurality of color converting layers being arranged on a portion of the emissive layer and configured to convert the emitted by the emissive layer into different color lights; at least one barrier arranged on the emissive layer between the plurality of color converting layers to spatially separate the plurality of color converting layers from each other; a first insulating layer provided between the plurality of color converting layers the emissive layer, the first insulating layer comprising a plurality of first openings respectively corresponding to the plurality of color converting layers; and a second insulating layer provided between the first insulating layer and the plurality of color converting layers.

A refractive index of at least one of the first and second insulating layers may be equal to or less than 1.6.

At least one of the first and second insulating layers may comprise at least one of $SiO_2$, SiN, $Al_2O_3$, and $TiO_2$.

The display device may further comprise a first reflective layer provided on an upper surface of the emissive layer, the first reflective layer configured to reflect the light incident from the emissive layer back into the emissive layer.

The upper surface and a side surface of the first reflective layer may be covered by the first insulating layer.

The first reflective layer may comprise a metal.

The first reflective layer may be provided between the plurality of first openings and spaced apart from the plurality of first openings.

The display device may further comprise a plurality of first electrodes provided on the emissive layer, each of the plurality of first electrodes respectively in contact with the emissive layer through one of the plurality of first openings.

At least one of the plurality of first electrodes may comprise a transparent electrode, and wherein the one of the plurality of first electrodes extends along an upper surface of the first insulating layer.

The transparent electrode may contact an entire area of the emissive layer exposed through the plurality of first openings.

The display device may further comprise a first electrode pad that is in contact with the transparent electrode.

The first electrode pad may be provided in an area of the transparent electrode, which does not overlap the plurality of first openings.

The display device may further comprise a second reflective layer provided on at least one of the plurality of first electrodes and comprising a second opening that at least partially overlaps one of the plurality of first openings.

At least a portion of the second reflective layer may overlap the first insulating layer.

The second reflective layer may comprise a third reflective layer and a fourth reflective layer that have different reflective characteristics.

The third reflective layer may face the emissive layer, wherein the fourth reflective layer faces one of the plurality of color converting layers, and wherein the third reflective layer has a reflectivity that is higher than a reflectivity of the third reflective layer.

At least one of the plurality of first electrodes may comprise a reflective electrode including a third opening overlapping one of the plurality of first openings and extending along an upper surface of the first insulating layer.

A first width of the third opening may be smaller than a second width of the one of the plurality of first openings.

The second insulating layer may contact the emissive layer through the first and third openings.

The display device may further comprise a second electrode contacting the emissive layer.

The plurality of first electrodes may be provided in a one-to-one correspondence with the plurality of color converting layers, and the second electrode is provided to correspond to at least one of the plurality of color converting layers.

The emissive layer may include a first semiconductor layer, an active layer, and a second semiconductor layer that are sequentially provided, wherein each of the plurality of first electrodes contacts the second semiconductor layer, and wherein the second electrode contacts the first semiconductor layer.

The second electrode may comprise: a via electrode passing through the first insulating layer and contacting the first semiconductor layer; and a second electrode pad provided on the first insulating layer and contacting the via electrode.

The second electrode is provided on a lower surface of the first semiconductor layer.

One of the at least one barrier may comprise at least one of a black matrix that absorbs light, a resin, and a polymer.

One of the at least one barrier may comprise: a core; and a shell surrounding a lateral surface of the core and reflecting incident light.

The plurality of color converting layers may comprise at least one of a red color converting layer emitting red color light, a green color converting layer emitting green color light, and a blue color converting layer emitting blue color light.

The emissive layer may generate at least one of blue color light and ultraviolet rays.

The display device may further comprise a light absorbing layer arranged on a lower surface of the emissive layer and absorbing incident light.

In accordance with another aspect of the disclosure, there is provided a display device comprising: a substrate; an emissive layer provided on the substrate; a first color converting element provided on a first section of the emissive layer and a second color converting element provided on a second section of the emissive layer; a barrier element provided between the first color converting element and the second color converting element; and a first insulating layer provided on the emissive layer, wherein the first insulating layer comprises a first opening corresponding to the first color converting element, and a second opening corresponding to the second color converting element.

The first opening may be provided directly above the first color converting element, and the second opening is provided directly above the second color converting element.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
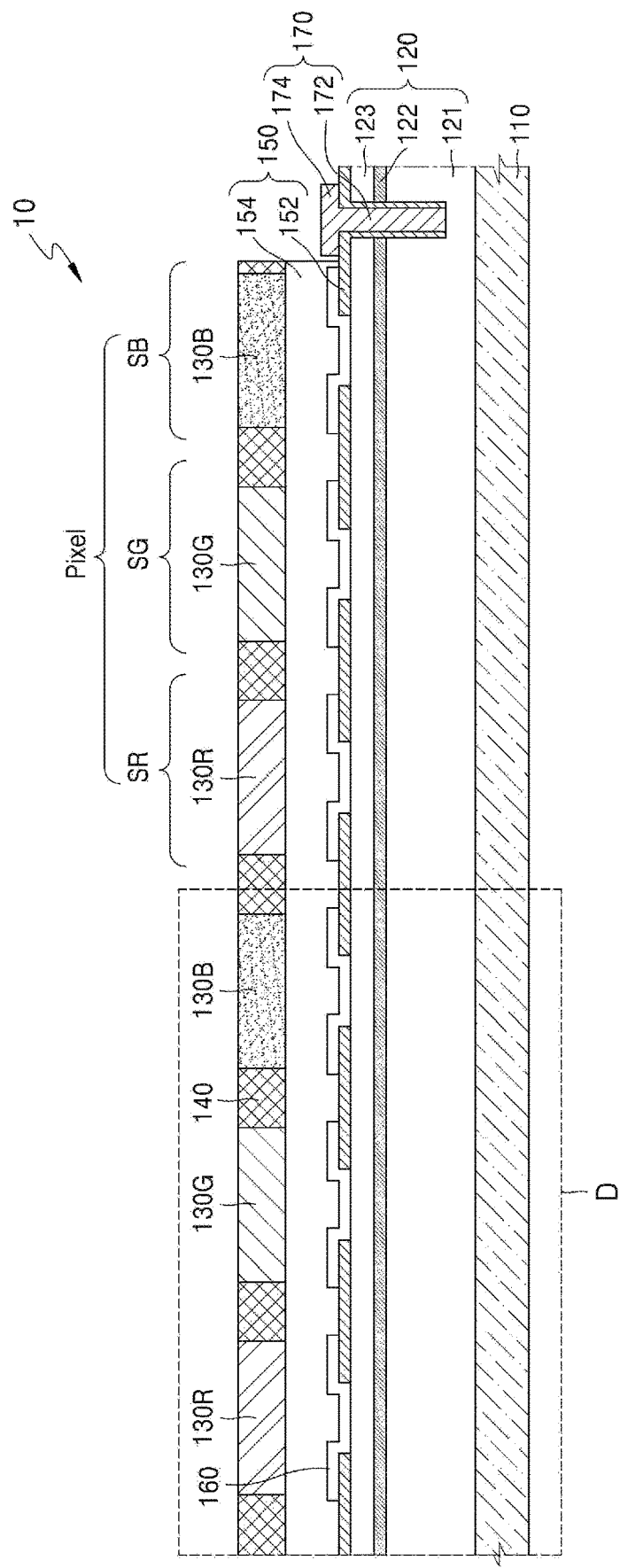
FIG. 1 is a cross-sectional view illustrating a display device according to an example embodiment.

Example embodiments will now be described more fully with reference to the accompanying drawings. In the drawings, like reference numerals denote like elements, and sizes of elements in the drawings may be exaggerated for clarity and convenience of description. Certain example embodiments described herein are examples only, and may include various modifications.

Throughout the specification, it will also be understood that when an element is referred to as being "on" another element, it can be directly on the other element, or intervening elements may also be present.

An expression used in the singular form encompasses the expression in the plural form, unless it has a clearly different meaning in the context. It is to be understood that the terms such as "including", etc., are intended to indicate the existence of the components, and are not intended to preclude the possibility that one or more other components may added.

While such terms as "first," "second," etc., may be used herein, the above terms are used only to distinguish one element from another.

An expression used in the singular encompasses the expression of the plural, unless it has a clearly different meaning in the context.

Expressions such as "at least one of," when preceding a list of elements, modify the entire list of elements and do not modify the individual elements of the list.

Figure 2:
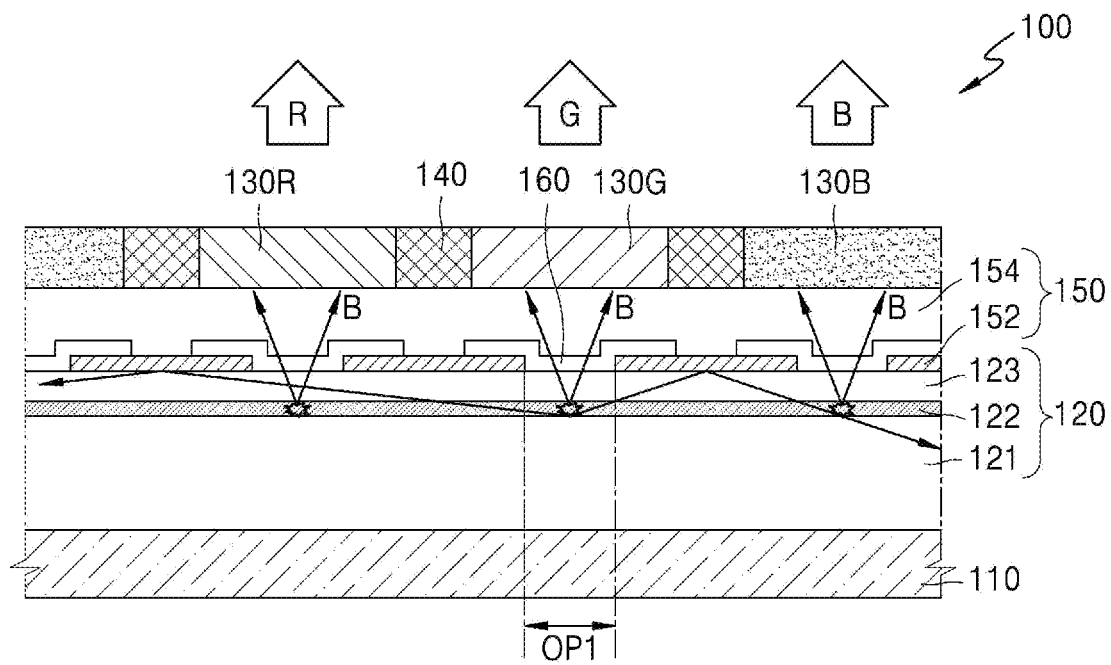
FIG. 2 is an expanded view of a region D of FIG. 1.

FIG. 1 is a cross-sectional view illustrating a display device 10 according to an example embodiment. FIG. 2 illustrates an expanded view of a portion D of FIG. 1.

Referring to FIGS. 1 and 2, the display device 10 may include a plurality of pixels. In FIG. 1, only two pixels are illustrated for convenience. Each of the pixels may include sub-pixels SR, SG, and SB, each configured to output different colors from each other. In detail, the sub-pixels SR, SG, and SB may respectively include a red sub-pixel SR, a green sub-pixel SG, and a blue sub-pixel SB.

The display device 10 may include a substrate 110, an emissive layer 120 arranged on the substrate 110, and a plurality of color converting layers (130R, 130G, and 130B) arranged on the emissive layer 120.

The substrate 110 may be a substrate used to grow the emissive layer 120. The substrate 110 may include various materials used in a typical semiconductor process. For example, a silicon substrate or a sapphire substrate may be used as the substrate 110. However, this is exemplary, and other various materials may also be used as the substrate 110.

The emissive layer 120 emitting light is arranged on a upper surface of the substrate 110. The emissive layer 120 may be an inorganic material-based light-emitting diode (LED) layer. The emissive layer 120 may emit, for example, blue color light B, but is not limited thereto. The emissive layer 120 may emit light of a certain wavelength according to a material included in the emissive layer 120. The emissive layer 120 may be formed by sequentially growing a first semiconductor layer 121, an active layer 122, and a second semiconductor layer 123 on the upper surface of the substrate 110.

The first semiconductor layer 121 may be arranged on the upper surface of the substrate 110. The first semiconductor layer 121 may include, for example, an n-type semiconductor, but is not limited thereto. The first semiconductor layer 121 may also include a p-type semiconductor according to circumstances. The first semiconductor layer 121 may include a Group III-V based n-type semiconductor, for example, n-GaN. The first semiconductor layer 121 may have a single-layer or multi-layer structure.

The active layer 122 may be arranged on an upper surface of the first semiconductor layer 121. The active layer 122 may emit light as electrons and holes combine with each other. The active layer 122 may have a multi-quantum well (MQW) structure, but is not limited thereto, and may also have a single-quantum well (SQM) structure according to circumstances. The active layer 122 may include a Group III-V based semiconductor, for example, GaN. While the active layer 122 is illustrated as a two-dimensional thin film as an example, the active layer 122 is not limited thereto, and may also have a three-dimensional shape such as a rod or pyramid structure through growth performed using a mask. According to an example embodiment, the active layer 122 may be arranged directly on the upper surface of the semiconductor layer 121.

The second semiconductor layer 123 may be arranged on an upper surface of the active layer 122. The second semiconductor layer 123 may include, for example, a p-type semiconductor, but is not limited thereto, and may include an n-type semiconductor according to circumstances. The second semiconductor layer 123 may include a Group III-V based p-type semiconductor, for example, p-GaN. The second semiconductor layer 123 may have a single-layer or multi-layer structure. According to an example embodiment, the second semiconductor layer 123 may be arranged directly on the upper surface of the active layer 122.

A plurality of color converting layers 130R, 130G, and 130B that convert light emitted from the active layer 122 of the emissive layer 120 to light of respective colors are arranged on the emissive layer 120. According to an example embodiment, the colors are predetermined colors. Each of the plurality of color converting layers 130R, 130G, and 130B may be arranged on a portion of the emissive layer 120. Thus, the plurality of color converting layers 130R, 130G, and 130B may share one emissive layer 120. The plurality of color converting layers 130R, 130G, and 130B may be formed using a photolithography method.

For example, the plurality of color converting layers 130R, 130G, and 130B may include a red color converting layer 130R, a green color converting layer 130G, and a blue color converting layer 130B. Thus, the red color converting layer 130R and a portion of the emissive layer 120 below the red color converting layer 130R may be an element of a red sub-pixel SR; the green color converting layer 130G and a portion of the emissive layer 120 below the green color converting layer 130G may be an element of a green sub-pixel SG; the blue color converting layer 130B and a portion of the emissive layer 120 below the blue color converting layer 130B may be an element of a blue sub-pixel SB.

The red color converting layer 130R may convert light emitted from the active layer 122 to red color light R and emit the same. The light emitted from the active layer 122 may be blue color light. The red color converting layer 130R may include quantum dots (QD) having a certain size, which are excited by blue color light and emit red color light R. The quantum dots may have a core-shell structure including a core portion and a shell portion or a particle structure without shells. The core-shell structure may have a single-shell or a multi-shell. The multi-shell may be, for example, a double-shell.

The quantum dots may include at least one of, for example, a Group II-VI based semiconductor, a Group III-V based semiconductor, a Group IV-VI based semiconductor, a Group IV based semiconductor, and graphene quantum dots. In detail, the quantum dots may include at least one of Cd, Se, Zn, S, and InP, but are not limited thereto. The quantum dots may have a diameter of several tens nm or less, for example, a diameter of about 10 nm or less. In addition, the red color converting layer 130R may include a phosphor that is excited by blue color light generated in the active layer 122 to emit red color light R. The red color converting layer 130R may further include a photoresist having excellent transmitting characteristics or a light dispersing agent that uniformly emits red color light R.

The green color converting layer 130G may convert light generated in the active layer 122 to green color light G and emit the same. The active layer 122 may generate blue color light B. The green color converting layer 130G may include quantum dots having a certain size, which are excited by blue color light B to emit green color light G. In addition, the green color converting layer 130G may include a phosphor that is excited by blue color light B generated in the active layer 122 to emit green color light G. The green color converting layer 130G may further include a photoresist or a light dispersing agent.

The blue color converting layer 130B may emit light generated in the active layer 122 as blue color light B. When light generated in the active layer 122 is blue color light B, the blue color converting layer 130B may be a transmissive layer that transmits through the blue color light B generated in the active layer 122, without wavelength conversion. When the blue color converting layer 130B is a transmissive layer, the blue color converting layer 130B may not include quantum dots and may include a photoresist or a light dispersing agent such as TiO2.

The display device 10 may further include at least one barrier 140. According to an example embodiment, the plurality of color converting layers 130R, 130G, and 130B are spatially spaced apart from each other by the at least one barrier 140 provided between the plurality of color converting layers 130R, 130G, and 130B. For example, the barrier 140 may be arranged between the red color converting layer 130R and the green color converting layer 130G and between the green color converting layer 130G and the blue color converting layer 130B. The barrier 140 may prevent color mixture between lights emitted from the color converting layers 130R, 130B, and 130G to increase a level of contrast. The barrier 140 may include at least one of a black matrix material, a resin, and a polymer.

The display device 10 may further include an insulating layer 150 between the emissive layer 120 and the plurality of color converting layers 130R, 130G, and 130B. The insulating layer 150 may be formed of a material having a smaller refractive index than a refractive index of the emissive layer 120. The insulating layer 150 may be formed of an insulating material having a refractive index of 1.6 or less. For example, the insulating layer 150 may include SiO2, SiN, Al2O3 or TiO2, but is not limited thereto. Thus, the insulating layer 150 may totally internally reflect light that is incident to the emissive layer 120 at a greater angle of threshold. For example, when the emissive layer 120 is formed of a GaN material and the insulating layer 150 is formed of SiO2, light incident to the insulating layer 150 at an angle of incidence of about 35 degrees or greater is totally internally reflected to proceed in a lateral direction of the emissive layer 120.

The insulating layer 150 may include a first insulating layer 152 arranged on the emissive layer 120 and a second insulating layer 154 arranged between the first insulating layer 152 and the plurality of color converting layers 130R, 130G, and 130B. The first insulating layer 152 may include a plurality of first openings OP1 respectively corresponding to the plurality of color converting layers 130R, 130G, and 130B. A current may be applied to the emissive layer 120 through the first openings OP1, and light generated in the emissive layer 120 may be incident to the color converting layers 130R, 130G, and 130B, to which the light corresponds, through the first openings OP1.

As a current may be applied through the first openings OP1, the first openings OP1 may be referred to as a current injection area, and since light is emitted from the emissive layer 120 through the first openings OP1, the first openings OP1 may be referred to as a light emission area. Even when the plurality of sub-pixels SR, SG, and SB share the emissive layer 120, the current injection area may be localized such that light is generated in a portion of the emissive layer 120 corresponding to a preset sub-pixel through the first openings OP1. Thus, the light emission area may be limited. Accordingly, effects due to optical interference among sub-pixels may be reduced.

The second insulating layer 154 may be formed on the emissive layer 120. According to an example embodiment, the second insulating layer 154 may be formed on the entire upper surface of the emissive layer 120 to increase total internal reflection effects and insulating effects. The first insulating layer 152 and the second insulating layer 154 may have an identical or different refractive index. When the first insulating layer 152 and the second insulating layer 154 have different refractive indices, the second insulating layer 154 may have a smaller refractive index than the refractive index of the first insulating layer 152. Thus, light that is generated in the emissive layer 120 and has transmitted through the first insulating layer 152 may also be totally internally reflected by the second insulating layer 154.

The display device 10 may further include a first electrode 160 and a second electrode 170 that are electrically connected to the emissive layer 120. The first electrode 160 may be electrically connected to the second semiconductor layer 123 of the emissive layer 120, and the second electrode 170 may be electrically connected to the first semiconductor layer 121 of the emissive layer 120. When the second semiconductor layer 123 includes a p-type semiconductor, the first electrode 160 may be a p-type electrode, and when the first semiconductor layer 121 includes an n-type semiconductor, the second electrode 170 may be an n-type electrode.

A plurality of first electrodes 160 may be included. The number of first electrodes 160 may be equal to the number of sub-pixels. That is, the first electrodes 160 may be respectively spaced apart from each other in some regions of the emissive layer 120 to respectively correspond to the plurality of color converting layers 130R, 130G, and 130B.

Each of the first electrodes 160 is in contact with the emissive layer 120 through the first openings OP1, thus limiting an area of contact between the first electrodes 160 and the second semiconductor layer 123. Accordingly, a current injected from the first electrodes 160 to the second semiconductor layer 123 may be localized to the first openings OP1 described above. Thus, light may be particularly generated only in an area of the active layer 122 below the color converting layers 130R, 130G, and 130B of a particular color. The generated light may only be incident to the color converting layers 130R, 130G, and 130B of a corresponding color, through the first openings OP1, and is less likely to travel to other sub-pixels in the vicinity. Even when light proceeds in a different direction than towards the first openings OP1, the light is totally internally reflected by the insulating layer 150 having a smaller refractive index than the refractive index of the emissive layer 120, and thus, light generated in a particular sub-pixel is not emitted through other sub-pixels. Thus, degradation in color quality may be reduced.

The plurality of first electrodes 160 may respectively be arranged to correspond to a plurality of sub-pixels SR, SG, and SB, that is, to the plurality of color converting layers 130R, 130G, and 130B in a one-to-one correspondence. For example, the first electrodes 160 may be respectively arranged below the red color converting layer 130R, the green color converting layer 130G, and 130B The first electrodes 160 may include a transparent conductive material. For example, the first electrodes 160 may include indium tin oxide (ITO), ZnO, indium zinc oxide (IZO), Ag, Au, Ni, graphene or nanowires, but are not limited thereto. Thus, light loss caused when light generated in the emissive layer 120 is incident to the color converting layers 130R, 130G, and 130B through the first electrodes 160 may be reduced.

The plurality of first electrodes 160 may also be electrically connected to a plurality of thin film transistors in a one-to-one correspondence. The thin film transistors selectively drive at least one sub-pixel of the plurality of the sub-pixels SR, SG, and SB.

The second electrode 170 may include a via electrode 172 and a first electrode pad 174. According to an example embodiment, the via electrode 172 passes through the first insulating layer 152 to contact the emissive layer 120, for example, the first semiconductor layer 121, and the first electrode pad 174. The first electrode pad 174 is arranged on the first insulating layer 152 and contacts the via electrode 172. A groove exposing the first semiconductor layer 121 may be formed by sequentially etching the second semiconductor layer 123, the active layer 122, and the first semiconductor layer 121, and the second electrode 170 may be provided in the groove. An insulating material may be formed on an inner wall of the groove and on the second semiconductor layer 123 around the groove. The insulating material is identical to an insulating material of the first insulating layer 152, and may be formed when forming the first insulating layer 152. Also, the via electrode 172 contacting the first semiconductor layer 121 may be formed and the first electrode pad 174 that is in contact with the first insulating layer 152 and the via electrode 172 may be formed.

The second electrode 170 may be a common electrode providing a common electrical signal to the plurality of sub-pixels SR, SG, and SB. As a common electrical signal is provided to a plurality of sub-pixels from one second electrode 170, the size of the sub-pixels SR, SG, and SB may be reduced.

Referring to FIG. 1, the second electrode 170 is arranged to commonly correspond to six sub-pixels SR, SG, and SB as an example. However, this is an example, and the number of sub-pixels SR, SG, and SG that commonly correspond to one second electrode 170 may vary in various manners. The second electrode 170 may include a highly conductive material.

In the above-described structure, when, for example, a thin film transistor corresponding to a red sub-pixel SR is driven to apply a certain voltage between the second electrode 170, which is a common electrode, and the first electrode 160 corresponding to the red sub-pixel SR, light is generated in a portion of the active layer 122 located below the red color converting layer 130R. As the generated light is incident to the red color converting layer 130R, the red color converting layer 130R converts the light to red light R to emit the same.

Alternatively, when a thin film transistor corresponding to a green sub-pixel SG is driven to apply a certain voltage between the second electrode 170, which is a common electrode, and the first electrode 160 corresponding to the green sub-pixel SG, light is generated in a portion of the active layer 122 located below the green color converting layer 130G. As the generated light is incident to the green color converting layer 130G, the green color converting layer 130G emits green light G to the outside.

Alternatively, when a thin film transistor corresponding to the blue sub-pixel SB is driven to apply a certain voltage between the second electrode 170, which is a common electrode, and the first electrode 160 corresponding to the blue sub-pixel SB, light is generated in the active layer 122 located below the blue color converting layer 130B. The generated light transmits through the blue color converting layer 130B to be emitted to the outside. FIG. 2 illustrates an example in which red color light R, green color light G, and blue color light B are respectively emitted from the red color converting layer 130R, the green color converting layer 130G, and the blue color converting layer 130B to be emitted to the outside.

According to the example embodiment, the display device 10 having a high resolution and an improved luminous efficiency may be implemented. According to the related art, to implement a display device 10 having a high resolution, compact LED chips corresponding to the sub-pixels SR, SG, and SB are to be manufactured separately and the compact LED chips need to be transferred at appropriate positions. Here, the active layers 122 are separated from each other for each sub-pixel, and thus, an exposed area of the active layers 122 is increased to degrade luminous efficiency and transferring the compact LED chips at accurate positions is difficult.

In the display device 10 according to an example embodiment, a plurality of sub-pixels SR, SG, and SB are arranged on one emissive layer 120 (specifically, the active layer 122), and thus, the manufacture of the display device 10 is easier than the related art manufacturing method since the display device 10 may be manufactured without transferring. In addition, the active layer 122, which is a light emission area, is not exposed for each sub-pixel, and thus luminous efficiency may be increased.

Meanwhile, the active layer 122 is shared by a plurality of sub-pixels, and thus, even when a most portion of the generated light is incident to the color converting layers 130R, 130G, and 130B, to which the light corresponds, a portion of the light may move in a lateral direction of the active layer 122 and proceed to other sub-pixels. The light that proceeds to other sub-pixels may be emitted to the outside through a color converting layer of other sub-pixels to emit an undesired color and thus may degrade color quality.

However, according to the display device 10 of the example embodiment, a light emission area of the upper surface of the emissive layer 120, that is, the area except the first openings OP1, is covered by the insulating layer 150 having a smaller refractive index than the emissive layer 120. Accordingly, light incident at an angle of incidence equal to or greater than a threshold angle is totally internally reflected at a boundary between the insulating layer 150 and the emissive layer 120 to thereby reduce emission of light through other sub-pixels.

Figure 3:
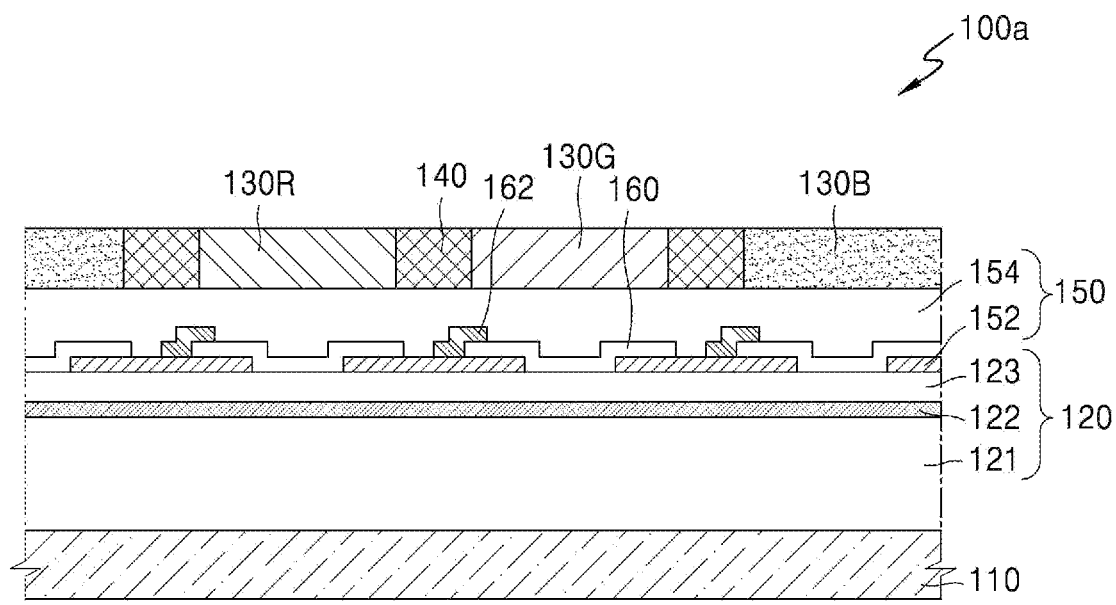
FIG. 3 is a cross-sectional view illustrating a display device including a first electrode pad according to an example embodiment.

FIG. 3 is a cross-sectional view illustrating a display device 100a including a second electrode pad 162, according to an example embodiment. When comparing FIGS. 2 and 3, the display device 100a of FIG. 3 may further include a plurality of second electrode pads 162 respectively contacting the plurality of first electrodes 160. The second electrode pads 162 may respectively be directly connected to electrodes of a thin film transistor. For example, the second electrode pads 162 may be formed as the electrodes of the thin film transistor are extended. The second electrode pads 162 may be formed of a highly conductive material, for example, a metal material. The second electrode pads 162 may be arranged on an area of the first electrodes 160 that does not overlap the first openings OP1. Thus, the second electrode pads 162 do not have to be transparent.

Figure 4:
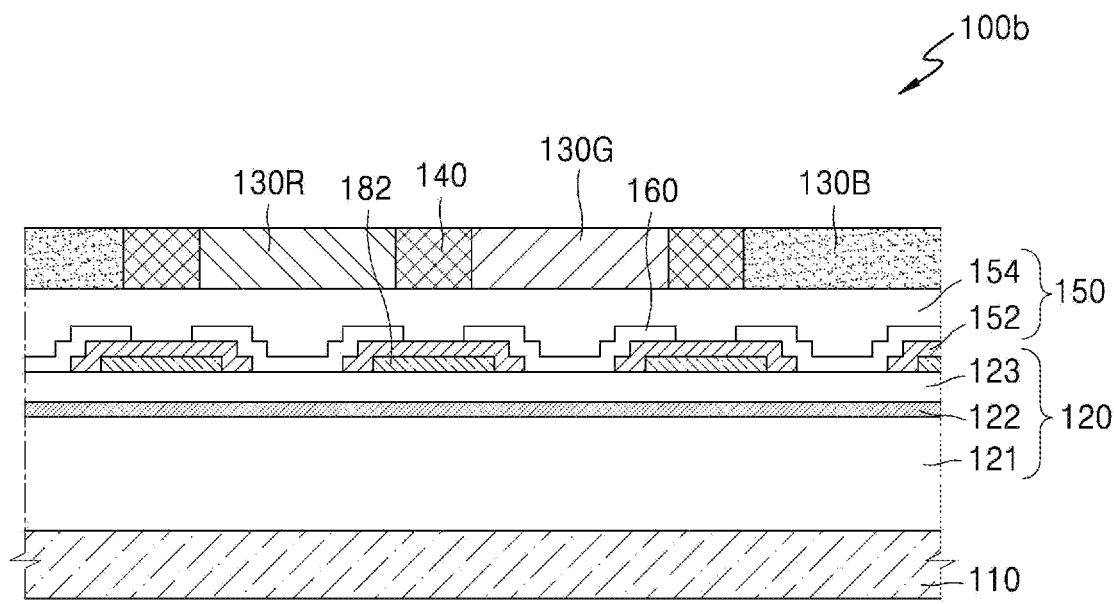
FIG. 4 is a cross-sectional view illustrating a display device including a first reflective layer according to an example embodiment.

FIG. 4 is a cross-sectional view illustrating a display device 100b including a first reflective layer 182, according to an embodiment. When comparing FIGS. 2 and 4, the display device 100b of FIG. 4 may further include a first reflective layer 182 that is in contact with an upper surface of the emissive layer 120 and reflects light incident from the emissive layer 120. An upper surface and all lateral surfaces of the first reflective layer 182 may be covered by the insulating layer 150, specifically, the first insulating layer 152. The first reflective layer 182 may be arranged between the sub-pixels SR, SG, and SB. In detail, the first reflective layer 182 may be arranged between the plurality of first openings OP1 arranged in the emissive layer 120. The first reflective layer 182 may be spaced apart from the first openings OP1 such that the first reflective layer 182 does not overlap the first openings OP1.

The first reflective layer 182 may be formed of a material having a high light reflectivity and may include, for example, a metal material. When light generated in the emissive layer 120 is incident, the light may be reflected. Due to a smaller refractive index of the insulating layer 150 than the emissive layer 120, light incident at an angle that is equal to or greater than a threshold angle may be totally internally reflected. However, a portion of light incident at an angle less than the threshold angle may transmit through the insulating layer 150 and be incident to a color converting layer of an undesired other color. Light incident to another color converting layer may be converted to light of another color that is not desired and be emitted to the outside. However, the first reflective layer 182 is arranged between the first openings OP1, and thus, even when light is incident at an angle less than the threshold angle, the light may be reflected by the first reflective layer 182 to thereby prevent light incidence to other color converting layers of other colors.

Figure 5:
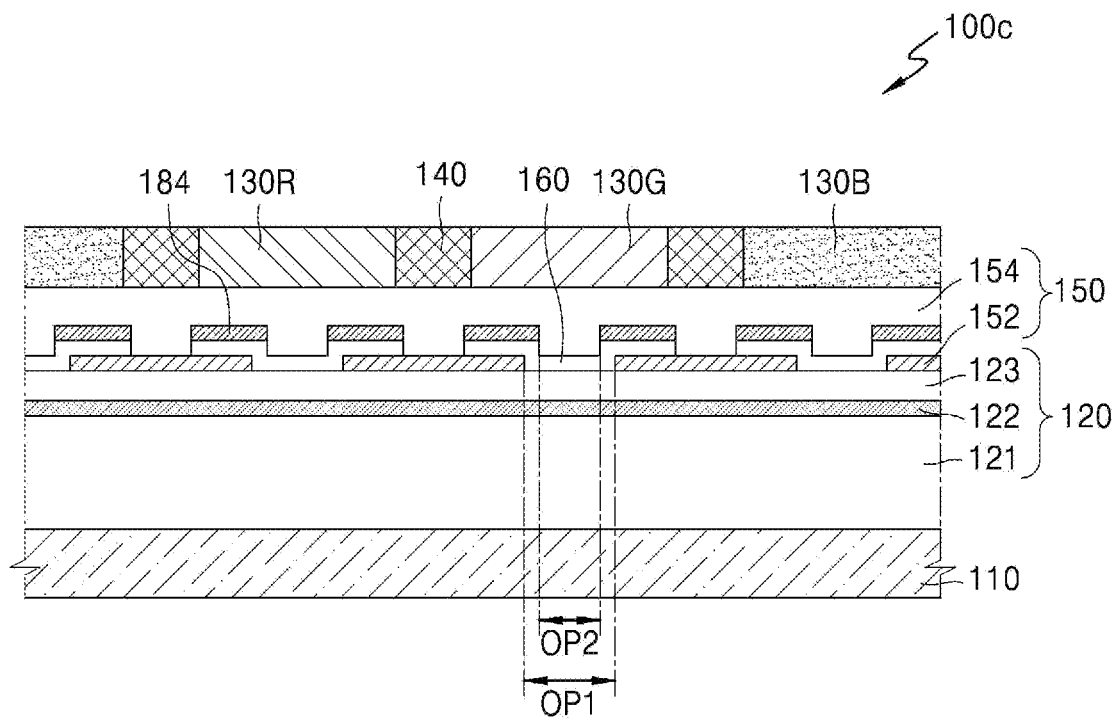
FIG. 5 is a cross-sectional view illustrating a display device including a second reflective layer according to an example embodiment.

FIG. 5 is a cross-sectional view illustrating a display device 100c including a second reflective layer 184, according to an example embodiment. When comparing FIGS. 2 and 5, the display device 100c of FIG. 5 may further include a second reflective layer 184 arranged on the first electrodes 160. The second reflective layer 184 may cover at least a portion of an upper surface of the first electrodes 160. The second reflective layer 184 may be formed of a material having a high light reflectivity, and the second reflective layer 184 may include, for example, a metal material.

The second reflective layer 184 may include a plurality of second openings OP2, and each of the second openings OP2 may overlap at least a portion of a first opening OP1, among the plurality of openings OP1 formed in the first insulating layer 152. The second openings OP2 functions, in addition to the first openings OP1, as a light path through which light generated in the emissive layer 120 proceeds to the color converting layers 130R, 130G, and 130B. Also, light that is generated in the emissive layer 120 and does not pass through the first openings OP1 and the second openings OP2 may be reflected by the insulating layer 150 or the second reflective layer 184, thus preventing emission of the light to the outside. According to an example embodiment, a width of each of the second openings OP2 is smaller than a width of the respective first openings OP1.

Moreover, in the second reflective layer 184, while light is incident to the color converting layers 130R, 130G, and 130B, to which the light corresponds, a portion of the light may be reflected by the color converting layers 130R, 130G, and 130B. The second reflective layer 184 reflects light that is not incident to the color converting layers 130R, 130G, 130B again to the color converting layers 130R, 130G, 130B, thereby increasing an efficiency of light incident to the color converting layers 130R, 130G, 130B.

Figure 6:
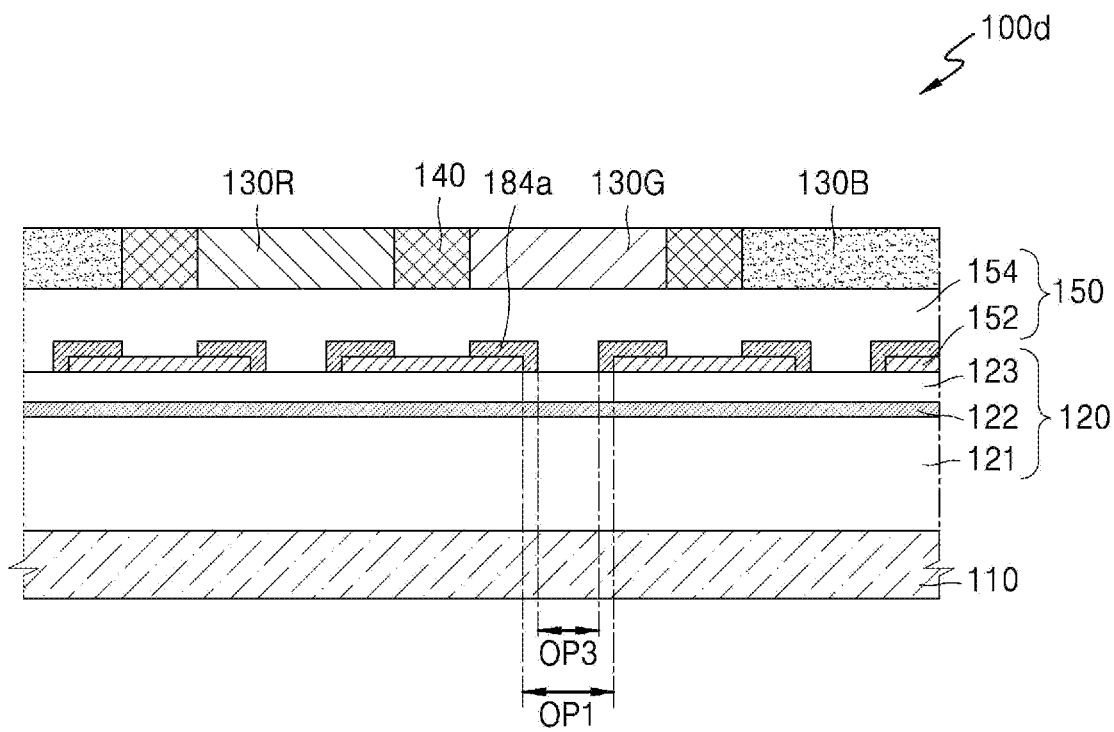
FIG. 6 is a cross-sectional view illustrating a display device including a second reflective layer according to another example embodiment.

FIG. 6 is a cross-sectional view illustrating a display device 100*d* including a second reflective layer 184*a*, according to another example embodiment. When comparing FIGS. 5 and 6, the display device 100*d* of FIG. 6 may not include first electrodes 160 but include only the second reflective layer 184*a*. The second reflective layer 184*a* may be formed of a material having a high reflectivity and also a high electrical conductivity. For example, the second reflective layer 184*a* may be formed of a metal.

The second reflective layer 184*a* may perform not only a function of reflecting light, but also a function as an electrode through which a current is injected into the emissive layer 120. Thus, the second reflective layer 184*a* may also be referred to as a reflective electrode. For example, a first end of the second reflective layer 184*a* may be in contact with the emissive layer 120 through one of the first opening OP1, and the other area of the second reflective layer 184*a* may extend onto an upper surface of the first insulating layer 152 along a lateral surface of the first insulating layer 152. In addition, the second reflective layer 184*a* also includes a plurality of third openings OP3, and each of the third openings OP3 may overlap at least a portion of a respective one of the first opening OP1. The third opening OP3 is smaller than the first opening OP1 in size. According to an example embodiment, a width of the third opening OP3 is smaller than a width of the first opening OP1.

Figure 7:
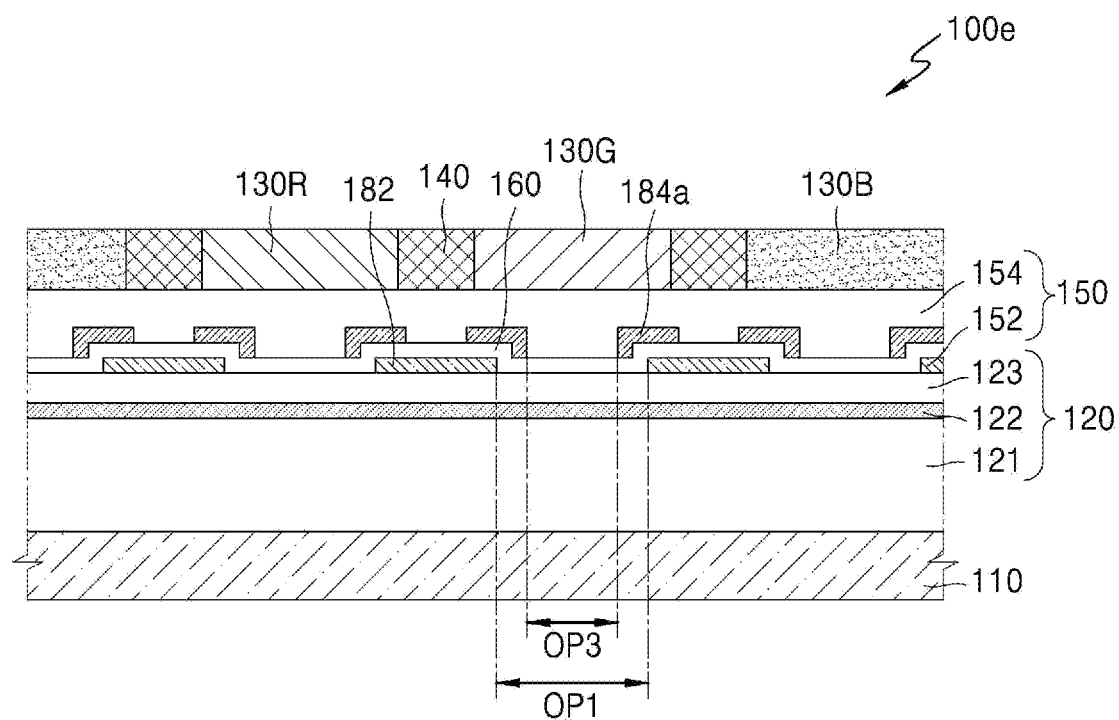
FIG. 7 is a cross-sectional view illustrating a display device including first and second reflective layers according to another example embodiment.

FIG. 7 is a cross-sectional view illustrating a display device 100*e* including first and second reflective layers 182 and 184*a*, according to another embodiment. When comparing FIGS. 6 and 7, the display device 100*e* of FIG. 7 may further include a first reflective layer 182 arranged between the emissive layer 120 and the first insulating layer 152. The entire upper surface of the first reflective layer 182 may be covered by the insulating layer 150. The first reflective layer 182 may be spaced apart from the first openings OP1 on the emissive layer 120 between the first openings OP1.

At least some portions of the first reflective layer 182 and the second reflective layer 184*a* may overlap each other. Thus, when viewing a pixel area of the display device 100*e* from above from the display device 100*e*, a light path area of the upper surface of the emissive layer 120, for example, an area except portions where the first openings OP1 and the third openings OP3 overlap each other, may be optically blocked by at least one of the first and second reflective layers 182 and 184*a*. Thus, light generated in the emissive layer 120 may be prevented from being emitted to other areas than areas where the first openings OP1 and the third openings OP3 overlap each other. Furthermore, an upper surface of the second reflective layer 184*a* reflects light towards the color converting layers 130R, 130G, and 130B, and thus, an efficiency of light incident to the color converting layers 130R, 130G, 130B may be increased.

At least one of the first reflective layer 182 and the second reflective layers 184 and 184*a* may include two heterogeneous layers having different optical characteristics. For example, the first reflective layer 182 may include first and second layers having different reflective characteristics. The first layer faces the emissive layer 120 and may be formed of a material having a relatively low reflectivity, and the second layer faces the color converting layers 130R, 130G, and 130B and may be formed of a highly reflective material. Thus, light that is reflected to proceed towards the active layer 122 may increase reflection loss, and light that is reflected and proceeds to the color converting layers 130R, 130G, and 130B may increase a reflection efficiency. In light proceeding to the active layer 122, light loss may occur due to the first layer, and thus light interference may be reduced. In light proceeding to the color converting layers 130R, 130G, and 130B, light loss is relatively small, and an efficiency of light incident to the color converting layers 130R, 130G, 130B may be increased accordingly.

The second reflective layers 184 and 184*a* also face the emissive layer 120, and may include a first layer formed of a material having a relatively low reflectivity and a second layer facing the color converting layers 130R, 130G, 130B and formed of a material having a relatively high reflectivity. The second reflective layers 184 and 184*a* may also reduce light interference by using the first layer and may increase a light efficiency by using the second layer.

Figure 8:
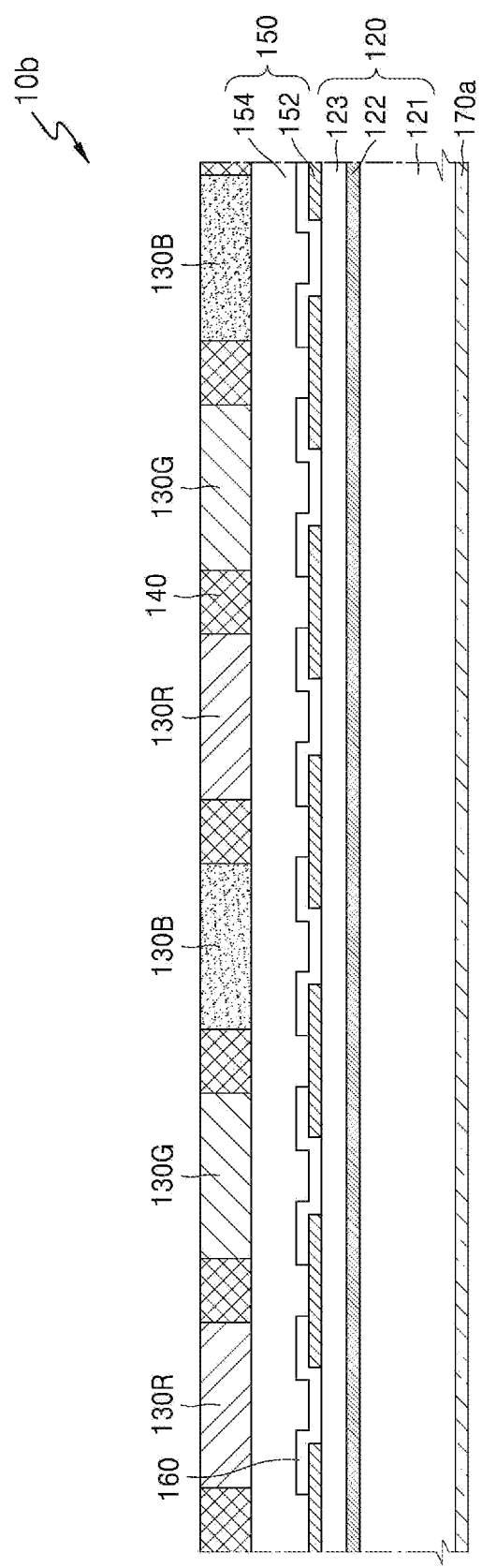
FIG. 8 illustrates a display device including a second electrode according to another example embodiment.
Figure 9:
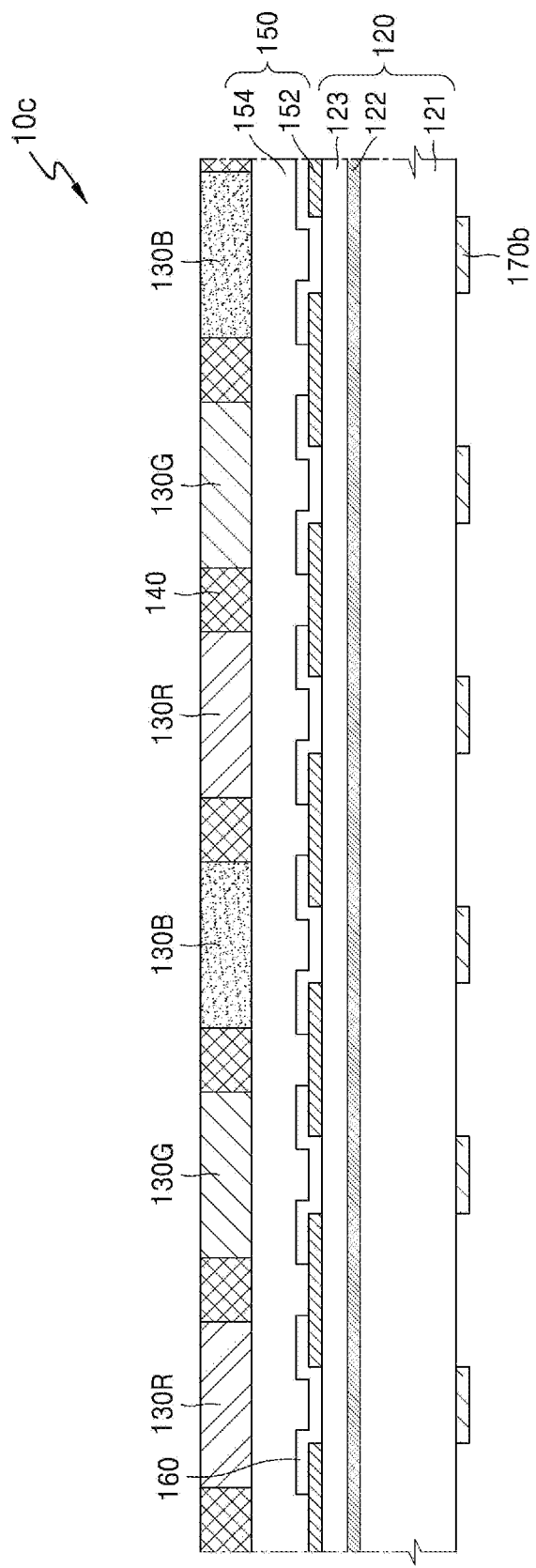
FIG. 9 illustrates a display device including a second electrode according to another example embodiment.

FIGS. 8 and 9 illustrate display devices 10*b* and 10*c* respectively including second electrodes 170*a* and 170*b*, according to another example embodiment. Comparing FIGS. 1 and 8, the second electrode 170*a* illustrated in the display device 10*b* of FIG. 8 may be arranged on a lower surface of the emissive layer 120. As the second electrode 170*a* is arranged on the lower surface of the second electrode 170*a*, a uniform distance with respect to the first electrode 160 of each sub-pixel may be provided. Thus, a uniform current path may be formed in the emissive layer 120 of each sub-pixel.

The second electrodes 170*b* illustrated in the display device 10*c* of FIG. 9 may be spaced apart from each other for each sub-pixel on a lower surface of the emissive layer 120. The first electrodes 160 and the second electrodes 170*b* may be arranged in units of sub-pixels in a one-to-one correspondence. As an electrical signal is applied to the first electrodes 160 and the second electrodes 170*b* in units of sub-pixels, light generated in the emissive layer 120 included in other sub-pixels may be reduced. When the substrate 110 is formed of a conductive material, the substrate 110 may function as a second electrode.

In a vertical structure in which the second electrodes 170*a* and 170*b*, the emissive layer 120, and the first electrodes 160 are sequentially formed, there is no need to provide an additional area to form the second electrodes 170 in the emissive layer 120, and thus, a display device having a small sub-pixel or a small pixel size may be implemented. Thus, a high-resolution display device may be implemented.

Figure 10:
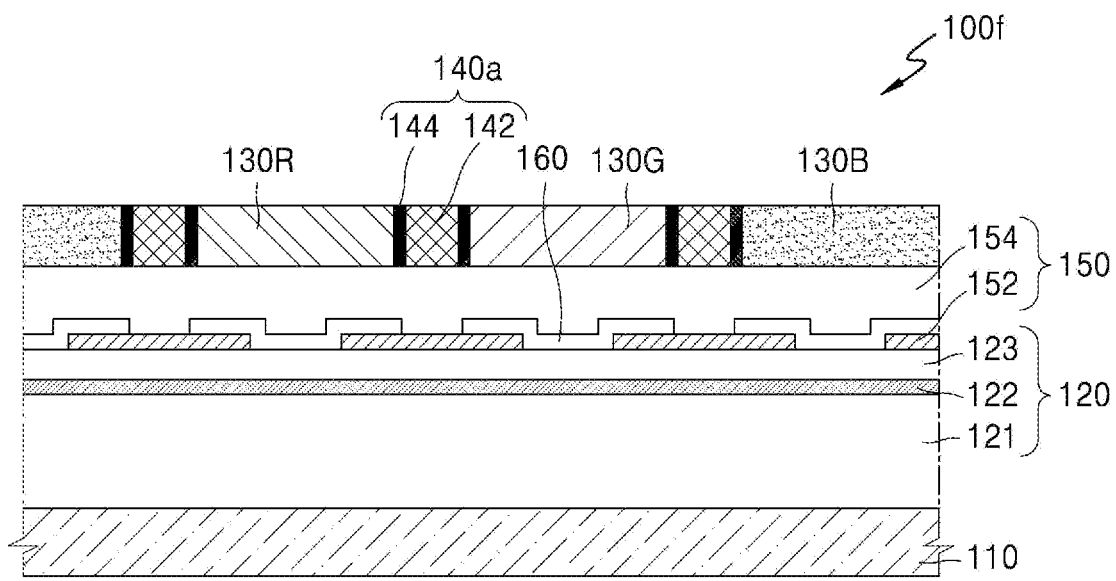
FIG. 10 illustrates a display device including a barrier according to another example embodiment.

FIG. 10 illustrates a display device 100*f* including a barrier 140*a* according to another example embodiment. When comparing FIGS. 2 and 10, the barrier 140*a* illustrated in FIG. 10 may include a core 142 and a shell 144. The shell 144 may include a highly reflective material. For example, the shell 144 may be formed of a metal material. When the barrier 140*a* is formed of a black matrix material, light incident to a black matrix may be absorbed, degrading an efficiency of light emitted to the color converting layers 130R, 130G, and 130B. However, as the barrier 140*a* of FIG. 10 includes the shell 144 having reflective characteristics, by reflecting light incident to the shell 144, a light efficiency of light emitted from the color converting layers 130R, 130G, and 130B may be increased. The core 142 may be formed of not only a black matrix, but also of an insulating material, a photoresist material, or the like.

Figure 11:
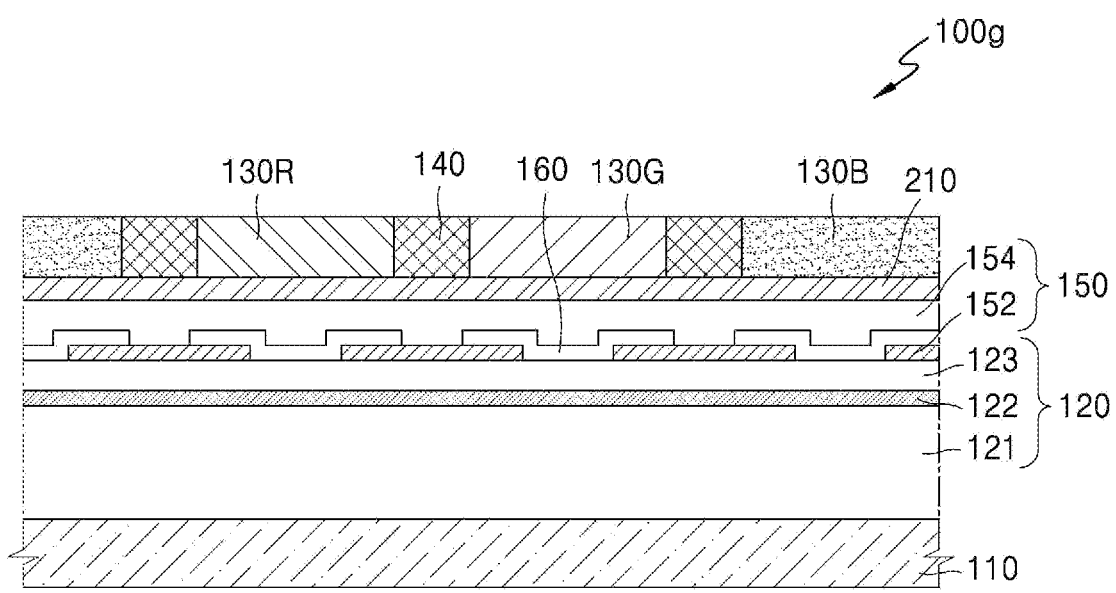
FIG. 11 illustrates a display device including a selective transparent insulating layer, according to an example embodiment.

FIG. 11 illustrates a display device 100*g* including a selective transparent insulating layer 210, according to an example embodiment. When comparing FIGS. 2 and 11, the display device 100*g* of FIG. 11 may further include a selective transparent insulating layer 210 between the color converting layers 130R, 130G, and 130B and the insulating layer 150. The transparent insulating layer 210 may transmit through light generated in the active layer 122 of the emissive layer 120 and reflect light generated in a plurality of color converting layers 130R, 130G, and 130B. The transparent insulating layer 210 may include a structure including a plurality of layers having different refractive indices.

Figure 12:
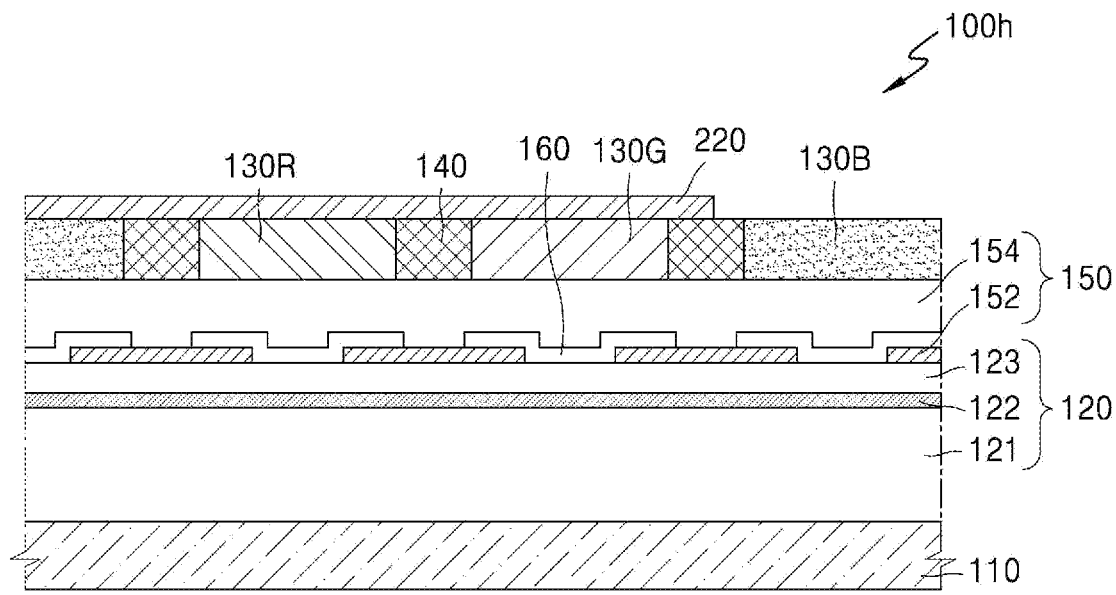
FIG. 12 illustrates a display device including a selective blocking layer, according to an example embodiment.

FIG. 12 illustrates a display device 100*h* including a selective blocking layer 220, according to an example embodiment. When comparing FIGS. 2 and 12, the display device 100*h* of FIG. 12 may further include a selective blocking layer 220 arranged on the color converting layers 130R, 130G, and 130B. The selective blocking layer 220 may be arranged only on the red color converting layer 130R and the green color converting layer 130G. The selective blocking layer 220 may include a blue color blocking filter that prevents blue color light B from being emitted to the outside from the red color converting layer 130R and the blue color converting layer 130B.

Figure 13:
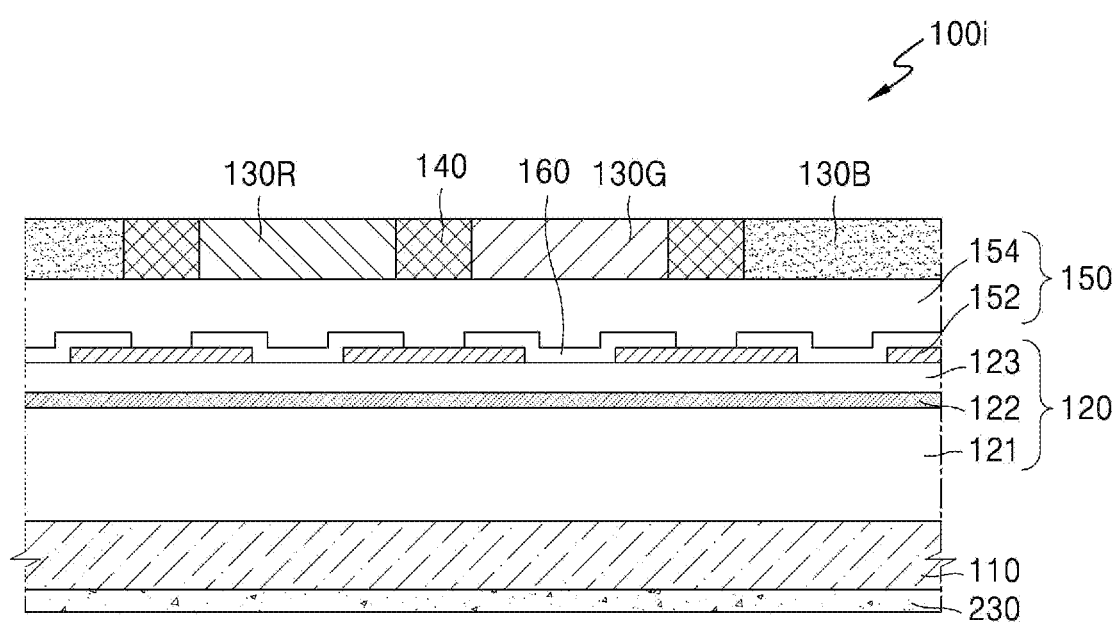
FIG. 13 illustrate a display device including a light absorbing layer, according to an example embodiment.
Figure 14:
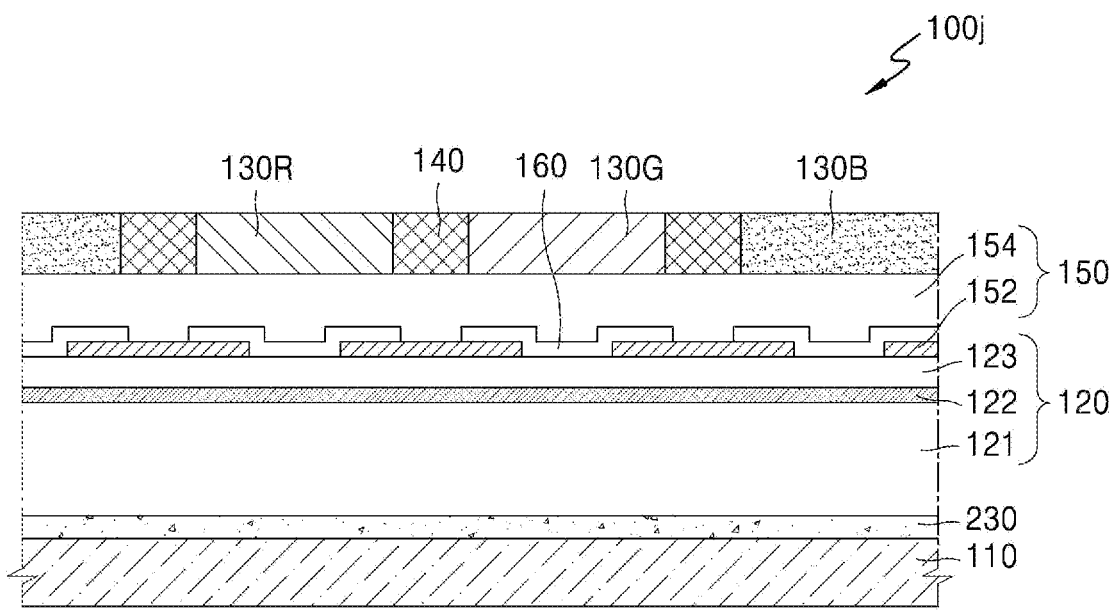
FIG. 14 illustrates a display device including a light absorbing layer, according to an example embodiment.

FIGS. 13 and 14 respectively illustrate display devices 100*i* and 100*j* including a light absorbing layer 230, according to example embodiments. The display device 100*i* or 100*j* may further include a light absorbing layer 230 that absorbs light that is generated in the emissive layer 120 and proceeds back to the emissive layer 120. The light absorbing layer 230 may be arranged on the emissive layer 120. For example, as illustrated in FIG. 13, the light absorbing layer 230 may be arranged on a lower surface of the substrate 110. The light absorbing layer 230 may absorb light that is generated in the emissive layer 120 and transmits through the substrate 110, thereby preventing light from being reflected by a lower surface of the substrate 110 and proceeding to an upper portion of the substrate 110. The light absorbing layer 230 may include a material having a similar refractive index as that of the substrate 110. For example, the light absorbing layer 230 may include a polymer-based material. Alternatively, as illustrated in FIG. 14, the light absorbing layer 230 may be arranged between the emissive layer 120 and the substrate 110.

Although not illustrated in the drawings, a refractive index matching layer may be arranged between the substrate 110 and the first semiconductor layer 121. The refractive index matching layer may reduce an amount of light reflected between the substrate 110 and the first semiconductor layer 121 due to a difference in the indices of refraction of the substrate 110 and the first semiconductor layer 121.

While blue color light B emitted from an active layer of the display device has been described above as an example, modifications may also be made such that ultraviolet ray (UV) is emitted from the active layer.

The display devices 100*a*, 100*b*, 100*c*, 100*d*, 100*e*, 100*f*, 100*g*, 100*h*, 100*i*, and 100*j* of FIGS. 3 through 14 are described based upon the display device 10 of FIG. 1 or the display device 100 of FIG. 2, but are not limited thereto. A display device may also be implemented by combining the elements of the display devices 100*a*, 100*b*, 100*c*, 100*d*, 100*e*, 100*f*, 100*g*, 100*h*, 100*i*, and 100*j* illustrated in FIGS. 3 through 14.

According to the example embodiments described above, as one active layer 122 is formed to correspond to a plurality of color converting layers 130R, 130G, and 130B, an exposed area of the active layer 122 may be minimized, thereby increasing optical efficiency. In addition, by using an insulating layer having a small refractive index, an area of contact of a semiconductor layer contacting an electrode may be limited to thereby not only reduce a light emission area of the active layer but also increase a color quality totally internally reflecting undesired light.

In addition, by arranging a reflective layer between an emissive layer and a color converting layer, light incident from the emissive layer is reflected to prevent emission of undesired light and light incident from the color converting layer may be reflected to increase an efficiency of emitted light.

Furthermore, by coating a reflective material on a barrier between color converting layers, light incident from the color converting layers may be reflected to thereby increase an efficiency of emitted light.

According to example embodiments, one active layer is formed to correspond to a plurality of color converting layers, such that an area whereby the active layer is exposed may be minimized, thereby increasing optical efficiency. In addition, by using an insulating layer having a small refractive index, an area of contact of a semiconductor layer contacting an electrode may be limited to thereby not only reduce a light emission area of the active layer but also increase a color quality by totally internally reflecting undesired light.

In addition, by arranging a reflective layer between an emissive layer and a color converting layer, light incident from the emissive layer is reflected to prevent emission of undesired light and light incident from the color converting layer may be reflected to increase an efficiency of emitted light.

Furthermore, by coating a reflective material on a barrier between color converting layers, light incident from the color converting layers may be reflected to thereby increase an efficiency of emitted light.

It should be understood that example embodiments described herein should be considered in a descriptive sense only and not for purposes of limitation. Descriptions of features or aspects within each example embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A display device comprising:
   an emissive layer implemented as a single layer and configured to emit light;
   a plurality of color converting layers provided on the emissive layer, each of the plurality of color converting layers being arranged on a portion of the emissive layer and configured to convert the light emitted by the emissive layer into different color lights;

at least one barrier arranged on the emissive layer between the plurality of color converting layers to spatially separate the plurality of color converting layers from each other;

a first insulating layer provided between the plurality of color converting layers and the emissive layer, the first insulating layer comprising a plurality of first openings respectively corresponding to the plurality of color converting layers;

a second insulating layer provided between the first insulating layer and the plurality of color converting layers; and wherein at least a portion of a bottom surface of the first insulating layer directly contacts an upper surface of the emissive layer, a refractive index of the first insulating layer is equal to or less than 1.6, the first insulating layer has a smaller refractive index than the emissive layer, and the second insulating layer has a smaller refractive index than the first insulating layer.

2. The display device of claim 1, further comprising a plurality of first electrodes respectively provided in the plurality of first openings.

3. The display device of claim 2, wherein each of the plurality of first electrodes respectively in contact with the emissive layer through one of the plurality of first openings.

4. The display device of claim 2, wherein each of the plurality of first electrodes extend from the bottom surface of the first insulating layer to an upper surface the first insulating layer to cover an entirety of a respective first opening of the plurality of first openings.

5. The display device of claim 2, wherein at least one of the plurality of first electrodes is transparent.

6. The display device of claim 2, further comprising a first electrode pad that is in contact with a first electrode of the plurality of first electrodes.

7. The display device of claim 6, wherein the first electrode pad is provided in an area of the first electrode, which does not overlap the plurality of first openings.

8. The display device of claim 2, further comprising a second reflective layer provided on at least one of the plurality of first electrodes and comprising a second opening that at least partially overlaps one of the plurality of first openings.

9. The display device of claim 8, wherein at least a portion of the second reflective layer overlaps the first insulating layer.

10. The display device of claim 2, wherein at least one of the plurality of first electrodes comprises a third opening overlapping one of the plurality of first openings and extending along an upper surface of the first insulating layer.

11. The display device of claim 2, further comprising a second electrode contacting the emissive layer.

12. The display device of claim 11, wherein the plurality of first electrodes are provided in a one-to-one correspondence with the plurality of color converting layers, and the second electrode is provided to correspond to at least one of the plurality of color converting layers.

13. The display device of claim 11, wherein the emissive layer includes a first semiconductor layer, an active layer, and a second semiconductor layer that are sequentially provided, wherein each of the plurality of first electrodes contacts the second semiconductor layer, and wherein the second electrode contacts the first semiconductor layer.

14. The display device of claim 13, wherein the second electrode comprises:

a via electrode passing through the first insulating layer and contacting the first semiconductor layer; and a second electrode pad provided on the first insulating layer and contacting the via electrode.

15. The display device of claim 13, wherein the second electrode is provided on a lower surface of the first semiconductor layer.

16. The display device of claim 1, wherein at least one of the first and second insulating layers comprises at least one of $SiO_2$, SiN, $Al_2O_3$, and $TiO_2$.

17. The display device of claim 1, wherein further comprising a first reflective layer provided on the upper surface of the emissive layer, the first reflective layer configured to reflect the light incident from the emissive layer back into the emissive layer.

18. The display device of claim 17, wherein an upper surface of the first reflective layer and a side surface of the first reflective layer are covered by the first insulating layer.

19. The display device of claim 18, wherein the first reflective layer is provided between the plurality of first openings and spaced apart from the plurality of first openings.

20. The display device of claim 17, wherein the first reflective layer is provided between the plurality of first openings and spaced apart from the plurality of first openings.

* * * * *